United States Patent
Wang et al.

(10) Patent No.: US 7,852,085 B2
(45) Date of Patent: Dec. 14, 2010

(54) RECEIVING DEVICE FOR A MAGNETIC RESONANCE IMAGING SYSTEM

(75) Inventors: Jian Min Wang, ShenZhen (CN); Bi Da Zhang, Shenzhen (CN); Yao Xing, Shenzhen (CN); Zeng He He, ShenZhen (CN)

(73) Assignee: Siemens Aktiengesellschaft, Munich (DE)

( * ) Notice: Subject to any disclaimer, the term of this patent is extended or adjusted under 35 U.S.C. 154(b) by 171 days.

(21) Appl. No.: 12/350,284

(22) Filed: Jan. 8, 2009

(65) Prior Publication Data

US 2009/0174408 A1    Jul. 9, 2009

(30) Foreign Application Priority Data

Jan. 8, 2008    (CN)    ........................ 2008 1 0000922

(51) Int. Cl.
*G01V 3/00*    (2006.01)
(52) U.S. Cl. ...................................... 324/318; 324/322

(58) Field of Classification Search ......... 324/300–322; 600/407–445
See application file for complete search history.

(56) References Cited

U.S. PATENT DOCUMENTS

| 6,870,367 | B2 * | 3/2005 | Kirsch .................... 324/309 |
| 7,359,745 | B2 * | 4/2008 | Lewin et al. ............... 600/410 |
| 7,573,266 | B2 * | 8/2009 | Feiweier et al. ............ 324/307 |
| 2009/0105582 | A1 * | 4/2009 | Dougherty et al. .......... 600/420 |

* cited by examiner

*Primary Examiner*—Brij B Shrivastav
(74) *Attorney, Agent, or Firm*—Schiff Hardin LLP

(57) ABSTRACT

A receiving device for an MRI (magnetic resonance imaging) system has multiple receiving coils. In the same imaging acceleration direction, a junction region is formed between adjacent receiving coils. An additional receiving coil is arranged on the junction region. The additional receiving coil covers at least partially a line of strong phase variation in sensitivity at the boundary of said junction region. This receiving device alleviates the problem of poor sensitivity to MRI signals in the junction region in the imaging acceleration direction, so as to improve the imaging quality in the junction region, and thus improving the overall imaging quality.

9 Claims, 3 Drawing Sheets

RECEIVING DEVICE FOR A MAGNETIC RESONANCE IMAGING SYSTEM

BACKGROUND OF THE INVENTION

1. Field of the Invention

The present invention relates to MRI technology and, particularly, to a receiving device for an MRI system.

2. Description of the Prior Art

MRI is an imaging technology that reconstructs an image by making use of magnetic resonance signals generated due to a magnetic resonance phenomenon of an atomic nucleus in a magnetic field. The basic principle of the magnetic resonance phenomenon lies in that the proton(s) in an atomic nucleus containing a singular number of protons, for example a proton in a hydrogen atomic nucleus that exists in large amounts in a human body, would have spin motion, which carries positive charge and generates a magnetic moment, just like a magnet, in an even magnetic field its spin axis would realign according to the direction of magnetic lines, and in this case, when excited by RF (Radio Frequency) pulses at a particular frequency, the magnet would absorb a certain amount of energy and start resonance, which is referred to as the magnetic resonance phenomenon.

In an MRI system, RF coils are formed by a transmitting coil and a receiving coil, which are important for generating the abovementioned magnetic resonance phenomenon. Taking the imaging inside a human body as an example, the transmitting coil is used to transmit RF pulses at a particular frequency towards the human body to excite the hydrogen atomic nuclei, and the hydrogen atomic nuclei inside the human body receive the RF pulses so as to start the resonance. After the transmitting coil has stopped transmitting the RF pulses, the hydrogen atomic nuclei in the human body transmit magnetic resonance signals to the receiving coil. The internal image in the human body can be formed by reconstruction with the magnetic resonance signals received by the receiving coil, thus the receiving coil carries out the function of receiving the magnetic resonance signals in an MRI system, and it is the receiving device for the MRI system, and its number can be one or more than one.

FIG. 1 shows a schematic view of a singular receiving coil for receiving magnetic resonance signals in the prior art. The receiving coil 11 can only receive the magnetic resonance signals in the same direction as the Z axis perpendicular to a horizontal plane where the receiving coil itself locates, and a tangent line at every point on a magnetic line 12 and in the same direction as the magnetic line represents a sensitivity vector of the receiving coil 11, wherein the larger is the component of the sensitivity vector along Z axis, the higher is the sensitivity of the receiving coil 11 to the magnetic resonance signals at the point corresponding to the sensitivity vector, thus the higher is the imaging quality reconstructed in a reconstruction algorithm by using the magnetic resonance signals received at that point. FIG. 1 only shows one magnetic line 12 of the receiving coil 11, and taking the points p1, p2 and p3 on the magnetic line 12 as examples, the sensitivity vector H1 of the point p1 has a component in the same direction as the Z axis, and the sensitivity vector H2 of the point p2 is perpendicular to the Z axis, i.e., it has no component in the same direction as the Z axis, and the sensitivity vector H3 of the point p3 itself is parallel to the Z axis, therefore, the sensitivity of the receiving coil 11 to the magnetic resonance signal at the point p1 lies between the sensitivities at the points p2 and p3, and the sensitivity to the magnetic resonance signal at the point p2 is the poorest, and the sensitivity to magnetic resonance signal at the point p3 is the best.

According to the above analysis approach, when considering all magnetic lines of the receiving coil 11, the points similar to the point p2, whose sensitivity vectors are perpendicular to Z axis, form connection lines at the boundary of the receiving coil 11, and such lines are generally referred to as lines of strong phase variation in sensitivity, FIG. 2 shows a schematic view of the lines of strong phase variation in sensitivity of the singular receiving coil in FIG. 1, and in FIG. 2 only two lines of strong phase variation in sensitivity 21 and 22 of the singular receiving coil 11 are shown. As shown in FIG. 2, all the points of the lines of strong phase variation in sensitivity 21 and 22 of the receiving coil 11 at the boundary have the poorest sensitivity to magnetic resonance signals, leading to relatively poor imaging quality, while a sensitivity to magnetic resonance signals at the middle position of the receiving coil 11 is the best, leading to better imaging quality.

In order to increase imaging speed and to enlarge imaging area, using a number of receiving coils for receiving magnetic resonance signals in MRI has become a technology attracting a lot of attention, and has become an important development direction for the future of MRI, and one of the abovementioned techniques of using a plurality of receiving coils for receiving magnetic resonance signals is the integrated parallel acquisition technique (IPAT), and it has rapidly become a popular technique. The reconstruction imaging algorithm in IPAT technique utilizes the respective sensitivity to the magnetic resonance signals for each coil to carry out space encoding, and the quality of the sensitivities of the respective receiving coils to the magnetic resonance signals will directly affect their imaging quality. The abovementioned space encoding also has a phase encoding direction, which can also be called an imaging acceleration direction, and which are two directions perpendicular to each other in the receiving coil plane; and every time the imaging is carried out, the space encoding is performed only to the sensitivity of magnetic resonance signals of the receiving coils in the same imaging acceleration direction, therefore every time the imaging is carried out, only the receiving coils located in the imaging acceleration direction to which a current imaging is directed will affect the sensitivity of magnetic resonance signals and the imaging quality.

Taking IPAT imaging as an example, there is a junction region between adjacent receiving coils, and FIG. 3 is a schematic view of a junction region of two receiving coils in the prior art. In FIG. 3, x, y represent two imaging acceleration directions, and it can be seen that only in the x direction are there two adjacent receiving coils 31 and 32 aligned. There are two junction arrangements for the receiving coils 31 and 32, the first is that the receiving coil 31 covers over the receiving coil 32, and the second is that the receiving coil 32 covers over the receiving coil 31, and in whatever junction manner, the receiving coil 31 is not closely connected with the receiving coil 32, but there is a layer of insulation material for separation at the junction points (marked by B1 and B2 in FIG. 3). FIG. 4 shows a schematic view of the lines of strong phase variation in sensitivity of the two receiving coils in FIG. 3, and in FIG. 4 are shown the lines of strong phase variation in sensitivity of the receiving coils 31 and 32 in the abovementioned two junction manners, the upper part of a phantom is the abovementioned first junction manner, and the lower part of the phantom is the abovementioned second junction manner, wherein the size of spacing between the receiving coil 31 and the receiving coil 32 is the thickness for filling in said insulation material. Similarly to the analysis of the singular receiving coil, the boundaries of the receiving coil 31 and the receiving coil 32 are still of the poorest sensitivity to magnetic resonance signals on the lines of strong phase variation in sensitivity, and since the junction region of abovementioned receiving coils 31 and 32 is formed by the boundaries of the receiving coils and the two receiving coils are located in the imaging acceleration direction x, the problem of relatively poor imaging quality when directing to the x direction also exists.

Therefore, although this manner of using multiple receiving coils to perform MRI can increase the imaging speed and extend the imaging area, there also exists the problem of relatively poor imaging quality in the junction region of adjacent receiving coils in the imaging acceleration direction to which the imaging directs, thus affecting the overall imaging quality.

SUMMARY OF THE INVENTION

An object of the present invention is to provide a receiving device for an MRI system, which receiving device can be used to improve the overall imaging quality.

The technical solution of the present invention is implemented as follows.

A receiving device for an MRI system has a number of receiving coils, wherein in the same imaging acceleration direction, a junction region is formed between adjacent receiving coils, wherein an additional receiving coil is arranged on the junction region, and the additional receiving coil covers at least partially a line of strong phase variation in sensitivity at the boundary of the junction region.

The imaging acceleration direction includes two directions perpendicular to each other in a receiving coil plane, and which are phase encoding directions for carrying out spatial encoding to the sensitivity of the magnetic resonance signals of the receiving coils. The junction region is the area of an overlapped part of said adjacent receiving coils. The line of strong phase variation in sensitivity at the boundary of the junction regions is formed by points where sensitivity vectors of the adjacent receiving coils are perpendicular to the direction capable of receiving magnetic resonance signals.

The adjacent receiving coils are separated by an insulation material at junction points where the junction region is formed; and said additional receiving coil is separated by an insulation material at the junction points with each one of the adjacent receiving coils.

The middle area of said additional coil covers the junction region.

The number of the adjacent receiving coils is two, and they are adjacent to each other; or the number of adjacent receiving coils is four, and they are respectively adjacent two by two.

In the receiving coils and the additional receiving coil, there is arranged a decoupling circuit for decoupling the coupling effects caused by the junction region and the coupling effects caused by said additional receiving coil after having covered at least partially the line of strong phase variation in sensitivity at the boundary of the junction region.

In summary, the receiving device for an MRI system provided by the present invention has more than one receiving coil, and in the junction region formed between the adjacent coils in the imaging acceleration direction is covered a receiving coil, which covered receiving coil covers the line of strong phase variation in sensitivity at the boundary of the junction region, so as to make use of the covered receiving coil to compensate the problem of relatively poor sensitivity of the junction region to magnetic resonance signals, so as to improve the imaging quality in the junction region, and to further improve the overall imaging quality.

DESCRIPTION OF THE PREFERRED EMBODIMENTS

The present invention will be further described in detail in conjunction with accompanying drawings and embodiments, so as to make the objects and advantages of the present invention more apparent; however, the description is not for limiting purpose.

The receiving device for an MRI system provided in the present invention has a number of receiving coils, wherein junction regions are formed between adjacent receiving coils. An additional receiving coil is disposed in the junction region, and the additional receiving coil covers at least part of the lines of strong phase variation in sensitivity at the boundary of the junction region.

In the subsequent reconstruction imaging algorithm, space encoding carried out to the sensitivity of the receiving coils of the abovementioned receiving device to the magnetic resonance signals can accomplish the imaging task, where the specific space encoding method is the same as that commonly known by those skilled in the art and thus need not be described in detail herein.

Figure 1:
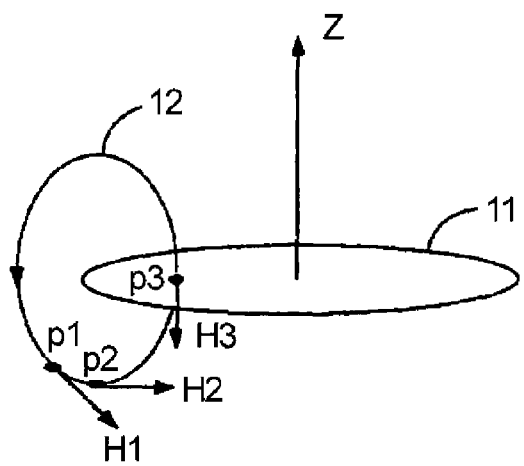
FIG. 1 is a schematic view of a singular receiving coil for receiving magnetic resonance signals in the prior art.
Figure 2:
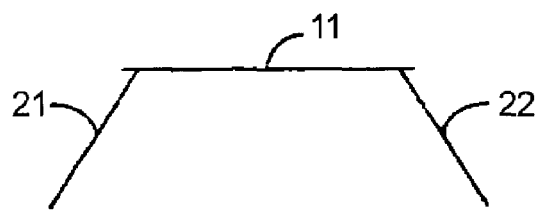
FIG. 2 is a schematic view of the lines of strong phase variation in sensitivity of the singular receiving coil shown in FIG. 1.
Figure 3:
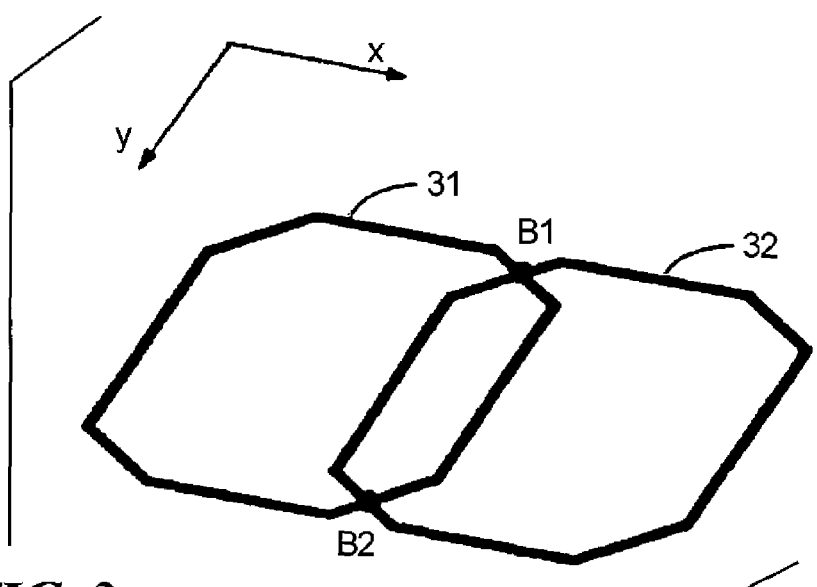
FIG. 3 is a schematic view of the junction between two receiving coils in the prior art.
Figure 4:
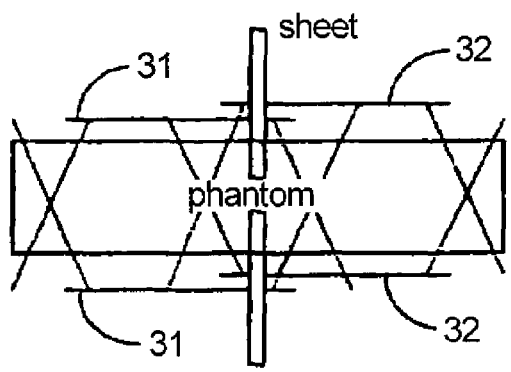
FIG. 4 is a schematic view of the lines of strong phase variation in sensitivity of the two receiving coils shown in FIG. 3.
Figure 5:
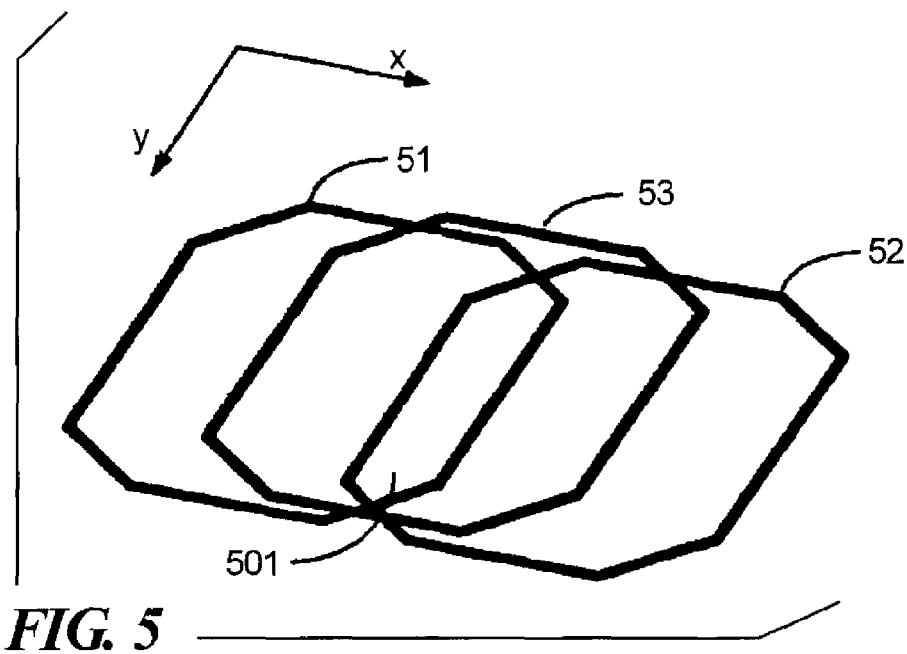
FIG. 5 is a structural diagram of a first embodiment of the receiving device for an MRI system of the present invention.

FIG. 5 is a structural diagram of a first embodiment of the receiving device for an MRI system of the present invention, in which, taking IPAT imaging system as an example, the receiving device comprises three receiving coils, and there are two imaging acceleration directions x and y. Particularly, the three receiving coils are respectively a receiving coil 51 and a receiving coil 52 in the imaging acceleration direction x, and a receiving coil 53 covering the junction region 501 between the receiving coil 51 and the receiving coil 52, and there is no receiving coil in the imaging acceleration direction y.

The sizes and shapes of the receiving coils 51-53 are not restricted, as long as they form closed shapes; shown in FIG. 5 is one case, that is, the receiving coils 51-53 are hexagon coils of the same size. The coverage position of the receiving coil 53 is not restricted either, as long as it covers at least part of the lines of strong phase variation in sensitivity at the boundary of the junction region 501; shown in FIG. 5 is one case, that is, the junction region 501 formed between the receiving coil 51 and the receiving coil 52 corresponds to the middle part of the receiving coil 53. The manner for the receiving coil 51 and the receiving coil 52 to form the junction is not restricted either; similarly to what has been explained already, there are two manners, and that shown in FIG. 5 is one specific junction manner thereof, that is, the receiving coil 53 covers over the receiving coil 51, and on this basis the receiving coil 53 covers over the junction region formed between the receiving coil 51 and the receiving coil 52, but each of the receiving coils is closely connected, being separated by an insulation material at the boundary points, which are not marked in FIG. 5.

Figure 6:
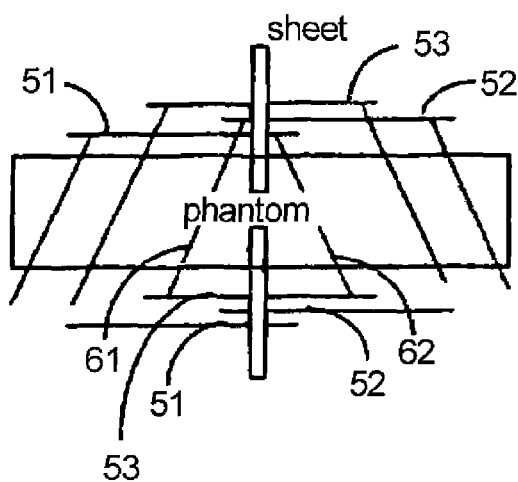
FIG. 6 is a schematic view of the lines of strong phase variation in sensitivity of the receiving device for an MRI system comprising three receiving coils.

FIG. 6 is a schematic view of the lines of strong phase variation in sensitivity of the receiving device for an MRI system comprising three receiving coils, wherein what is shown at the upper portion of a phantom corresponds to the junction manner of the receiving coils shown in FIG. 5, while what is shown in the lower portion of the phantom is the other junction manner of receiving coils different from what is shown in FIG. 5, only two of the lines of strong phase variation in sensitivity of each receiving coil are shown, and the spacing size between the receiving coil 51 and the receiving coil 52 is the thickness for filling in the insulation material. The receiving coil 53 covers the lines of strong phase variation in sensitivity at the boundary of the junction region 501, there are only two lines of strong phase variation in sensitivity shown for each receiving coil according to FIG. 6, and the middle portion of the receiving coil 53 covers the lines 61 and 62 of strong phase variation in sensitivity. Therefore, although the sensitivity of the receiving coil 51 to the magnetic resonance signals is relatively poor at the line 62 of strong phase variation in sensitivity and the sensitivity of the receiving coil 52 to magnetic resonance signals is relatively poor at the line 61 of strong phase variation in sensitivity, the middle portion of the receiving coil 53 covering the lines 61 and 62 of strong phase variation in sensitivity has a high sensitivity to the magnetic resonance signals. Therefore, by having the receiving coil 53 cover the junction region 501 formed between the receiving coil 51 and the receiving coil 52, it can compensate for the defect that the junction region 501 has a poor sensitivity to the magnetic resonance signals, thus improving the imaging quality of the junction region 501 formed between the receiving coil 51 and the receiving coil 52, and further improving the overall imaging quality. Other lines of strong phase variation in sensitivity at the boundary of the junction region 501 not shown in FIG. 6 are in the same situation as the lines 61 and 62 of strong phase variation in sensitivity as shown in FIG. 6.

It can also be seen in FIG. 6 that, although there also exist the lines of strong phase variation in sensitivity at the boundary of the receiving coil 53, that is, the receiving coil 53 also has relatively poor sensitivity to the magnetic resonance signals on the lines of strong phase variation in sensitivity at its own boundary, since the receiving coils 51-53 have the same size, and the middle portion of the receiving coil 53 covers the junction region 501 formed between the receiving coil 51 and the receiving coil 52, as shown in FIG. 6, the lines of strong phase variation in sensitivity of the boundary of the receiving coil 53 correspond respectively to the middle portions of the receiving coil 51 and the receiving coil 52, so the receiving coil 51 and the receiving coil 52 can compensate for the defect that the imaging quality on the lines of strong phase variation in sensitivity at the boundary of the receiving coil 53 is poor. Therefore, covering the receiving coil 53 over the junction region 501 will not lead to the problem that the imaging quality in the junction region 501 is improved while the imaging quality in other areas is damaged.

Figure 7:
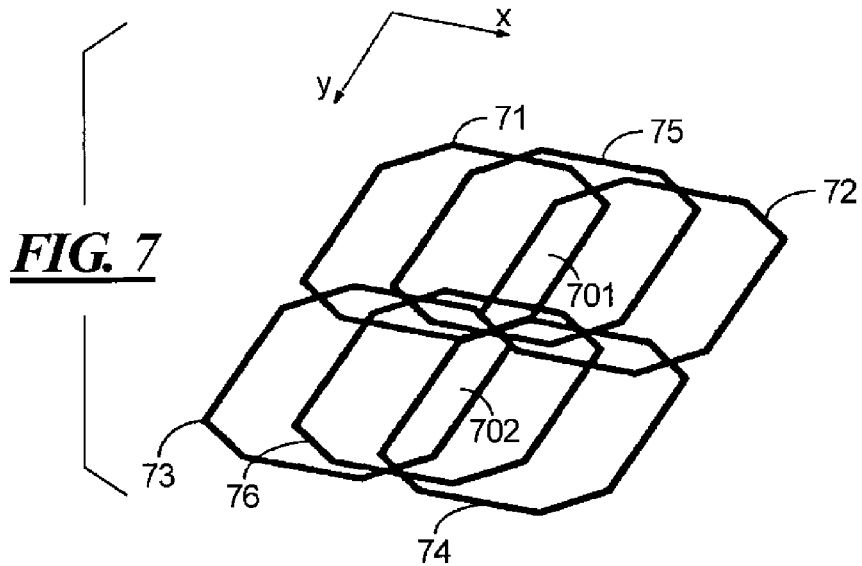
FIG. 7 is a structural diagram of a second embodiment of the receiving device for an MRI system of the present invention.

FIG. 7 is a structural diagram of the second embodiment of the receiving device for an MRI system in the present invention, taking an IPAT imaging system for example. It comprises six receiving coils, and the imaging acceleration directions include two directions x and y, wherein the arrangement of the receiving coil 71 and the receiving coil 72 as well as the arrangement of the receiving coil 73 and the receiving coil 74 are positioned in the imaging acceleration direction x, while the arrangement of the receiving coil 71 and the receiving coil 73 as well as the arrangement of the receiving coil 72 and the receiving coil 74 are positioned in the imaging acceleration direction y, and the receiving coils 71-74 are adjacent to each other two by two and form a square. Assuming that in this embodiment the imaging acceleration direction x is selected for imaging every time, it is necessary to cover the receiving coils over the junction regions formed between the receiving coils positioned in the imaging acceleration direction x.

Similarly, the sizes and shapes of the receiving coils 71-76 are not restricted, as long as they form a closed shape; shown in FIG. 7 is one particular case thereof, that is, the receiving coils 71-76 are hexagon coils of the same size. The coverage positions of the receiving coil 75 and the receiving coil 76 are not restricted either, as long as they cover the lines of strong phase variation in sensitivity at the boundary of the junction region 701 and the junction region 702; and in FIG. 7 is shown one particular case thereof that is, the middle portion of the receiving coil 75 covers over the junction region 701, and the middle portion of the receiving coil 76 covers over the junction region 702. The junction manner of the receiving coil 71 and the receiving coil 72 as well as the junction manner of the receiving coil 73 and the receiving coil 74 are not restricted either; shown in FIG. 7 is one of the particular junction manners, that is, the receiving coil 72 covers over the receiving coil 71, so on this basis the middle portion of the receiving coil 75 covers over the junction region 701, and the receiving coil 74 covers over the receiving coil 73, so on this basis the middle portion of the receiving coil 76 covers over the junction region 702, and the receiving coil 75 covers over the receiving coil 74.

The middle portion of the receiving coil 75 covers over the junction region 701 formed between the receiving coil 71 and the receiving coil 72 and covers the lines of strong phase variation in sensitivity at the boundary of the junction region 701. Therefore, although the sensitivity to the magnetic resonance signals is relatively poor on the lines of strong phase variation in sensitivity at the boundary of the receiving coil 71 and the receiving coil 72, the middle portion of the receiving coil 73 has relatively high sensitivity to the magnetic resonance signals, thus the receiving coil 73 can compensate for the defect that the sensitivity to the magnetic resonance signals is relatively poor on the lines of strong phase variation in sensitivity at the boundary of the junction region, so as to improve the imaging quality of the junction region 701 formed between the receiving coil 71 and the receiving coil 72.

Similarly, the imaging quality of the junction region 702 formed between the receiving coil 73 and the receiving coil 74 can also be improved due to the coverage of the receiving coil 76. Therefore, in the imaging acceleration direction x, the imaging quality of the existing two junction regions is improved, and thus the overall imaging quality would also be improved.

Although there also exists a junction region between the covered receiving coil 75 and the receiving coil 76, since the arrangement of the receiving coil 75 and the receiving coil 76 is positioned in the imaging acceleration direction y, instead of in the imaging acceleration direction x selected in this embodiment, the junction region formed between the receiving coil 75 and the receiving coil 76 will not affect the imaging quality in the imaging acceleration direction x.

FIG. 7 shows only the case that the junction region formed between the receiving coils is covered by the receiving coils when choosing imaging acceleration direction x, and the case of choosing imaging acceleration direction y is entirely the same as the analysis mentioned above.

In the receiving device for an MRI system provided in the present invention, since there are receiving coils covered on the junction region formed between adjacent receiving coils in the imaging acceleration direction, it is equivalent to enlarging the junction proportion between the receiving coils, which will make the coupling effects between the receiving coils stronger. However, by adopting a decoupling method the coupling effects between the receiving coils can be eliminated, due to the fact that the way to decouple between the receiving coils has become a mature technology and is not the object of discussion here. Only two decoupling methods are briefly introduced here, to explain that covering the receiving coils over the junction regions formed between adjacent receiving coils will not lead to other uncontrollable defects in the aspect of increased coupling effects.

A first decoupling method uses a preamplifier of the receiving coil for decoupling. In this decoupling method, in each receiving coil of the receiving device for an MRI system there is arranged a preamplifier, making each receiving coil together with the arranged preamplifier form a parallel resonance loop so as to realize the decoupling. The abovementioned parallel resonance loop can comprise: a receiving coil, a first loop formed by a first capacitor and a second capacitor. The connection point of the receiving coil and the second capacitor is connected to ground. A second loop formed by the second capacitor, a third capacitor, a fourth capacitor and a first inductor in series. The connection point of said second capacitor and first inductor is connected to ground, and the preamplifier is connected to the connection point of the third capacitor and the first inductor of said second loop.

Figure 8:
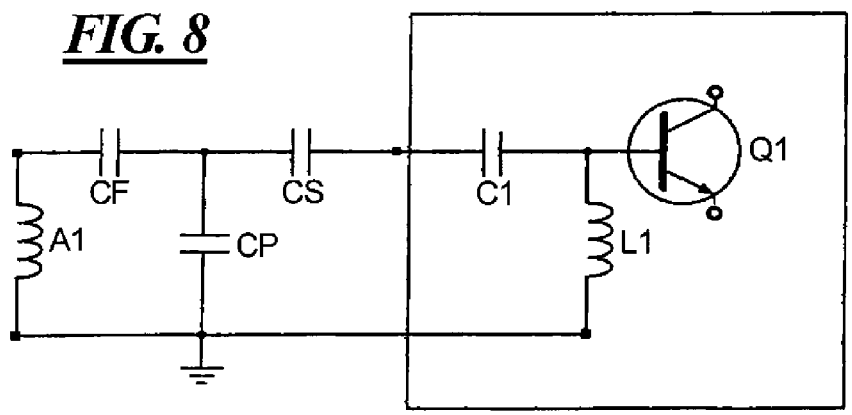
FIG. 8 is a diagram of working principles for carrying out decoupling by forming a parallel resonance circuit.

FIG. 8 is a diagram of working principles of the decoupling by forming a parallel resonance loop, wherein the receiving coil is marked with A1, which coil can be any one of the receiving coils in the above introduced embodiments, for example, the receiving coil 51 shown in FIG. 5 or the receiving coil 73 shown in FIG. 7, and the preamplifier provided for the receiving coil A1 is denoted as Q1, Cf is the abovementioned first capacitor, Cp is the abovementioned second capacitor, Cs is the abovementioned third capacitor, C1 is the abovementioned fourth capacitor, and L1 is the abovementioned first inductor, and the portion in the box shown in this figure can be referred to as a matching circuit for the preamplifier. The way to form the parallel resonance loop shown in FIG. 8 is only a specific example, and by using the parallel resonance loop formed it can achieve the effects of an open circuit, so that no current exists in the receiving coil A1 so as to reduce the coupling by a magnetic flux; a parallel resonance loop can be formed for each receiving coil according to the principles shown in FIG. 8, and since in each receiving coil there is no current, the coupling between the receiving coils is eliminated naturally. As to the specific arrangement of the elements in each matching circuit of the parallel resonance loop, there are many different embodiments, which are commonly used technical means by those skilled in the art and will not be described redundantly.

Figure 9:
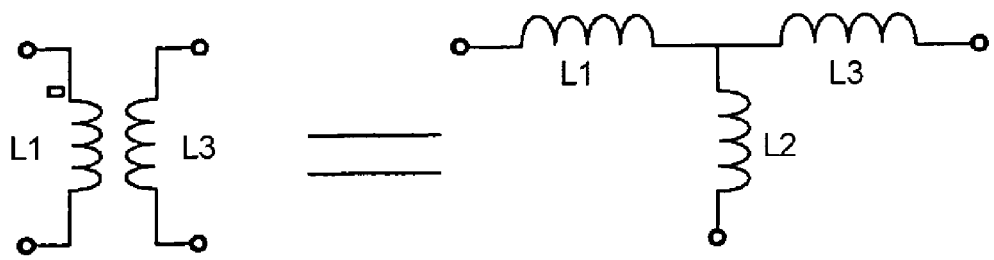
FIG. 9 is a diagram of working principles for carrying out decoupling by an equivalent circuit.

The second decoupling method is to decouple by way of an equivalent circuit. In all the receiving coils included in the receiving device for an MRI system, every two receiving coils are regarded as a pair of coupled inductors, and taking the receiving coil introduced above and shown in FIG. 5 as an example, the receiving coils 51 and 52, the receiving coils 51 and 53 and the receiving coils 52 and 53 can be respectively regarded as pairs of coupled inductors; by utilizing basic circuit principles, a pair of coupled inductors can be treated as equivalent to a T-type circuit, and FIG. 9 is a diagram of the principles for decoupling by an equivalent circuit. As shown in FIG. 9, L1 and L3 in the T-type circuit are the coupled inductors of the two receiving coils respectively, while L2 is a leakage inductor of the two receiving coils. It is only necessary to provide the T-type circuit with a decoupling circuit, which decoupling circuit can make L2 short-circuited, so as to realize the elimination of the current in the coupled inductors of the two receiving coils, and to ensure that neither of the two receiving coils has any current and to reduce the coupling by the magnetic flux, thus achieving the purpose of decoupling between the receiving coils. As to the particular composition of the decoupling circuit configured for the T-type circuit, there are many embodiments according to different requirements, which are also the commonly used technical means by those skilled in the art and will not be described here redundantly.

In the abovementioned two embodiments of the receiving device for MRI system of the present invention, the number of the receiving coils, the imaging acceleration direction, the covered portion of the junction region by the covered receiving coils, the sizes and shapes of the receiving coils, and the chosen specific imaging algorithm described therein are only by way of examples, and are not to limit the scope of the present invention. It can be understood that, according to actual needs, the number of receiving coils different from that given in the embodiments can be used, the covered receiving coils are not restricted to always using the middle part to cover a junction region. For example, in the application situations where the requirements for imaging quality is not very high, other portions of the covered receiving coils with better sensitivity to the magnetic resonance signals other than the middle portion can also be used to cover the junction region, or each receiving coil is not restricted to always choosing the hexagon coil with equal size, or other parallel imaging algorithm different from IPAT can also be used, that is, each specific parameter of the embodiments listed in the present invention can be adjusted according to different practical requirements. As long as it covers a receiving coil over a junction region formed between adjacent receiving coils in the imaging acceleration direction as provided in the present invention, the purpose of improving overall imaging quality can be achieved.

Although modifications and changes may be suggested by those skilled in the art, it is the intention of the inventors to embody within the patent warranted hereon all changes and modifications as reasonably and properly come within the scope of their contribution to the art.

We claim as our invention:

1. A receiving device for a magnetic resonance imaging system, comprising:
   a plurality of receiving coils, said receiving coils being arranged relative to each other to form a junction region between adjacent ones of said receiving coils, said junction region having a boundary at which a line of strong phase variation in sensitivity of the respective adjacent receiving coils forming the junction region exists; and
   an additional receiving coil disposed on the junction region, and at least partially covering said line of strong phase variation in sensitivity at said boundary of said junction region.

2. A receiving device as claimed in claim 1 wherein said plurality of receiving coils are arranged relative to each other to cause said imaging acceleration direction to comprise two directions perpendicular to each other in a receiving coil plane, said two directions being respective phase encoding directions for spatially encoding magnetic resonance signals received by the respective receiving coils to the sensitivities of the respective receiving coils.

3. A receiving device as claimed in claim 1 wherein said junction region comprises an area that is overlapped by respective portions of said adjacent receiving coils.

4. A receiving device as claimed in claim 1 wherein said line of strong phase variation in sensitivity at said boundary or said junction region is formed by points at which sensitivity vectors of said adjacent receiving coils are perpendicular to a reception direction, for receiving magnetic resonance signals, of the respective adjacent receiving coils.

5. A receiving device as claimed in claim 1 comprising insulating material separating the adjacent receiving coils from each other at junction points of said junction region, and wherein said additional receiving coil is separated by insulating material at said junction points with respect to each of said adjacent receiving coils.

6. A receiving device as claimed in claim 1 wherein said additional coil has a central area that covers said junction region.

7. A receiving device as claimed in claim 1 wherein said adjacent receiving coils consist of two of said receiving coils.

8. A receiving device as claimed in claim 1 wherein said adjacent receiving coils consists of four of said receiving coils, adjacent in respective pairs, and wherein said imaging acceleration direction comprises two directions perpendicular to each other in a receiving coil plane, said two directions comprising phase encoding directions for spatially encoding respective sensitivities of said pairs of adjacent receiving coils to magnetic resonance signals received thereby.

9. A receiving device as claimed in claim 1 wherein said plurality of receiving coils are arranged relative to each other to cause said imaging acceleration direction to comprise two directions perpendicular to each other in a receiving coil plane, said two directions being respective phase encoding directions for spatially encoding magnetic resonance signals received by the respective receiving coils to the sensitivities of the respective receiving coils, said plurality of receiving coils and said additional receiving coil having a decoupling circuit connected thereto that decouples coupling effects caused by said junction region and coupling effects caused by said additional receiving coil.

* * * * *